US012597453B2

(12) United States Patent
Sheu

(10) Patent No.: US 12,597,453 B2
(45) Date of Patent: Apr. 7, 2026

(54) ELECTRONIC DEVICE INCLUDING TWO CIRCUIT MODULES WITH LONG-DISTANCE SIGNAL TRANSMISSION

(71) Applicant: Realtek Semiconductor Corp., HsinChu (TW)

(72) Inventor: Jeong-Fa Sheu, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 281 days.

(21) Appl. No.: 18/499,228

(22) Filed: Nov. 1, 2023

(65) Prior Publication Data

US 2024/0170033 A1 May 23, 2024

(30) Foreign Application Priority Data

Nov. 23, 2022 (TW) .................................. 111144733

(51) Int. Cl.
 *G11C 7/22* (2006.01)
 *G11C 7/10* (2006.01)
 *G11C 8/18* (2006.01)
(52) U.S. Cl.
 CPC ............ *G11C 7/222* (2013.01); *G11C 7/1096* (2013.01); *G11C 8/18* (2013.01)
(58) Field of Classification Search
 CPC .......... G11C 7/222; G11C 7/1096; G11C 8/18
 See application file for complete search history.

(56) References Cited

U.S. PATENT DOCUMENTS

| | | | | |
|---|---|---|---|---|
| 2002/0131308 A1* | 9/2002 | Hirabayashi | ..... | G11C 29/50012 |
| | | | | 365/200 |
| 2004/0041579 A1* | 3/2004 | Kim | .................... | G06F 11/2733 |
| | | | | 714/E11.171 |
| 2007/0230259 A1* | 10/2007 | Nishigaki | ................. | G06F 5/12 |
| | | | | 365/189.12 |
| 2013/0166938 A1* | 6/2013 | Palaniappan | ............. | G06F 1/12 |
| | | | | 713/400 |
| 2013/0250701 A1* | 9/2013 | Bringivijayaraghavan | ................. | |
| | | | | G11C 7/222 |
| | | | | 365/191 |
| 2016/0172018 A1* | 6/2016 | Nam | .................... | G11C 7/1087 |
| | | | | 365/189.05 |

OTHER PUBLICATIONS

Clifford E. Cummings, Simulation and Synthesis Techniques for Asynchronous FIFO design, 2002, Sunburst Design, USA.

* cited by examiner

*Primary Examiner* — Jaweed A Abbaszadeh
*Assistant Examiner* — Ayman Fatima
(74) *Attorney, Agent, or Firm* — Winston Hsu

(57) ABSTRACT

An electronic device includes a first circuit module and a second circuit module, wherein the first circuit module includes a write pointer generation circuit and a write data generation circuit for generating a write pointer and a write data; and the second circuit module includes a storage unit, a read pointer generation circuit and a comparator. The storage unit is used for storing the write data, the read pointer generation circuit is used for generating a read pointer, the comparator compares the write pointer and the read pointer to determine whether to read the write data from the storage unit, the write pointer and the write data are sent to the second circuit module through multiple wires, and a signal propagation time of the multiple wires is greater than one cycle of a clock signal used by the first circuit module.

7 Claims, 2 Drawing Sheets

ELECTRONIC DEVICE INCLUDING TWO CIRCUIT MODULES WITH LONG-DISTANCE SIGNAL TRANSMISSION

BACKGROUND OF THE INVENTION

1. Field of the Invention

The present invention is related to circuit module design, and more particularly, to two circuit modules with long-distance signal transmission that do not need to use retimed pipeline flip-flops on a long wired path.

2. Description of the Prior Art

A very large-scale integrated (VLSI) circuit is usually divided into multiple circuit modules, wherein each circuit module will be made into a hard macro when a circuit layout is performed. If a part of the hard macro is at a distance, the signal is transmitted through a long-distance wire. When a clock frequency used by the hard macro is too high, the above-mentioned long-distance signal transmission may take several to tens of clock cycles. In order to address a setup time violation problem of flip-flops caused by the long-distance signal transmission, it is traditionally necessary to insert one-stage retimed pipeline flip-flops at appropriate intervals on the long-distance wire.

The above-mentioned insertion of the one-stage retimed pipeline flip-flops has the following disadvantages. This work relies heavily on experience of automatic placement and routing (APR) engineers during the circuit layout, is inefficient, and related circuit designs cannot be reused for a next project. In addition, the inserted retimed pipeline flip-flops result in a larger chip area. Since each flip-flop requires a clock signal to be triggered, complexity of a clock tree design is increased.

SUMMARY OF THE INVENTION

It is therefore one of the objectives of the present invention to provide two circuit modules with long-distance signal transmission that do not need to use retimed pipeline flip-flops on a long wired path, to address the above-mentioned issues.

According to an embodiment of the present invention, an electronic device is provided. The electronic device comprises a first circuit module and a second circuit module. The first circuit module comprises a write pointer generation circuit and a write data generation circuit for generating a write pointer and a write data, respectively. The second circuit module comprises a storage unit, a read pointer generation circuit, and a comparator. The storage unit is arranged to store the write data. The read pointer generation circuit is arranged to generate a read pointer. The comparator is arranged to compare the write pointer with the read pointer to determine whether to read the write data from the storage unit for generating a read data. In addition, the write pointer generated by the write pointer generation circuit and the write data generated by the write data generation circuit are sent to the second circuit module through multiple wires, respectively, and a signal propagation time of the multiple wires is greater than one cycle of a first clock signal used by the first circuit module.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
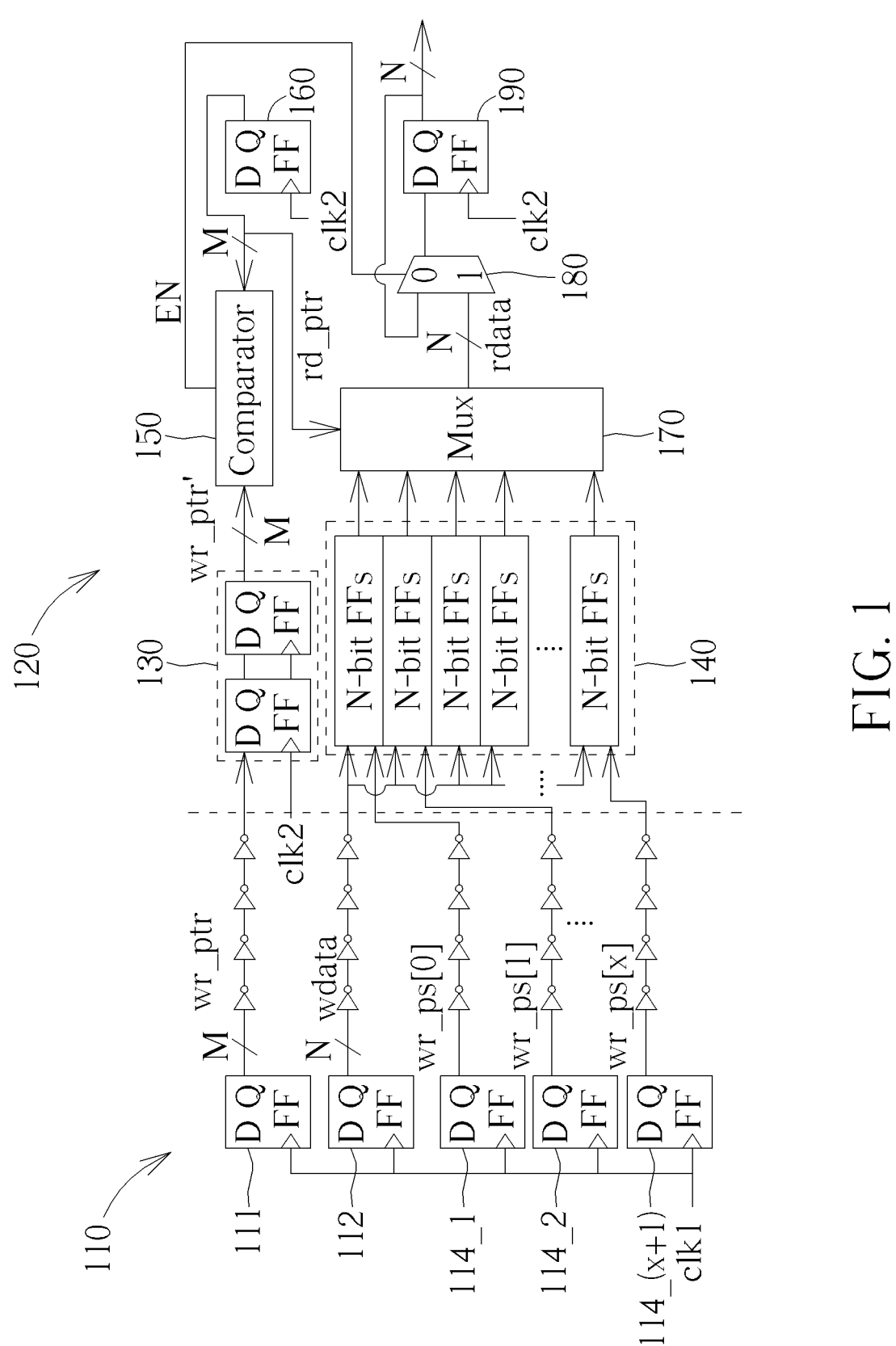
FIG. 1 is a diagram illustrating an electronic device including a first circuit module and a second circuit module according to an embodiment of the present invention.

FIG. 1 is a diagram illustrating an electronic device including a first circuit module 110 and a second circuit module 120 according to an embodiment of the present invention. As shown in FIG. 1, the first circuit module 110 includes a write pointer generation circuit 111, a write data generation circuit 112, and multiple write pulse generation circuits 114_1-114_(x+1). The write pointer generation circuit 111 is arranged to generate a write pointer wr_ptr with a width of M bits. The write data generation circuit 112 is arranged to generate write data wdata with a width of N bits. The write pulse generation circuits 114_1-114_(x+1) are arranged to generate write pulse signals wr_ps[0]-wr_ps[x], respectively. It should be noted that output terminals of the write pointer generation circuit 111, the write data generation circuit 112, and the write pulse generation circuits 114_1-114_(x+1) are implemented by flip-flops, but the present invention is not limited thereto. The second circuit module 120 includes a synchronizer 130 (e.g., clock domain crossing (CDC) synchronizer), a storage unit 140, a comparator 150, a read pointer generation circuit 160, multiple multiplexers (MUXs) 170 and 180, and an output circuit 190. The synchronizer 130 may be implemented by multiple (e.g., stages of) flip-flops, and the read pointer generation circuit 160 and the output circuit 190 may be implemented by flip-flops. The storage unit 140 includes multiple flip-flops, such as multiple flip-flops with a width of N and a depth of (x+1) shown in FIG. 1.

In this embodiment, the first circuit module 110 is arranged to write data into the second circuit module 120, and there are long-distance wires between the first circuit module 110 and the second circuit module 120 for signal transmission. Specifically, each of the write pointer generation circuit 111, the write data generation circuit 112, and the write pulse generation circuits 114_1-114_(x+1) transmits a signal to the second circuit module 120 through multiple inverters or multiple buffers, wherein signal propagation time is several clock cycles (e.g., 8-10 clock cycles), signal delay between two adjacent inverters/buffers is smaller than one cycle of a clock signal clk1, the inverters or the buffers are disposed on the wires, respectively, to drive the write pointer and the write data, and there are no flip-flops on the wires. In general, trace lengths of the write pointer wr_ptr, the write data wdata, and the write pulse signals wr_ps[0]-wr_ps[x] should be as similar as possible (e.g., be equal to each other in length), and a number of inverters/buffers on the wires should also be as close as possible (e.g., be equal to each other). This design can make the long-distance wires obtain similar propagation delay time under different process variations, temperatures, and voltage changes. In addition, the first circuit module 110 uses the clock signal clk1 for circuit operations, and the second circuit module 120 uses a clock signal clk2 for circuit operations, wherein the clock signal clk1 and the clock signal clk2 can belong to the same clock domain or different clock domains.

In this embodiment, the synchronizer 130 is arranged to avoid a metastable problem of the write pointer wr_ptr in the process of clock domain crossing. As a result, the synchronizer 130 may include two or more stages of flip-flops. In addition, a depth of flip-flops of the storage unit 140 should be greater than or equal to a sum of a parameter and a number of stages of flip-flops within the synchronizer 130. When the clock signals clk1 and clk2 have the same frequency (i.e., clock frequency), the parameter may be "2". When the clock signals clk1 and clk2 have different frequencies, the parameter can be determined according to a ratio of the frequencies. For example, under a condition that the synchronizer 130 has a two-stage flip-flop and the clock signals clk1 and clk2 have the same frequency, the depth of the flip-flops of the storage unit 140 can be any value greater than or equal to "4" (i.e., "x" shown in FIG. 1 can be any value greater than or equal to "3"). In addition, each N-bit flip-flop in the storage unit 140 can be regarded as an entry (i.e., the depth of the flip-flops of the storage unit 140 is a number of entries), and the write pointer wr_ptr is arranged to point to a specific entry in the storage unit 140. As a result, a number of bits of the write pointer wr_ptr and the depth of the flip-flops of the storage unit 140 should satisfy the following relationship: $2^M > D$, wherein M is the number of bits of the write pointer wr_ptr, and D is the depth of the flip-flops of the storage unit 140. For example, under a condition that the depth of the flip-flops of the storage unit 140 is "6", M should be greater than or equal to "3".

In operations of the first circuit module 110, the write pointer generation circuit 111 generates the write pointer wr_ptr to point to an entry of the storage unit 140 to enable a write pulse signal corresponding to the entry, to write the write data wdata into the corresponding entry. For example, assume that the write pointer generation circuit 111 generates the write pointer wr_ptr to point to a first entry of the storage unit 140. The write pulse generation circuit 114_1 will generate the write pulse signal wr_ps[0] to the first entry of the storage unit 140, to trigger a flip-flop therein to store the write data wdata from the write data generation circuit 112. At this point, the remaining write pulse signals wr_ps[1]-wr_ps[x] are in a disable state (e.g., are maintained at a low voltage level). After that, assume that the write pointer generation circuit 111 generates the write pointer wr_ptr to point to a second entry of the storage unit 140. The write pulse generation circuit 114_2 will generate the write pulse signal wr_ps[1] to the second entry of the storage unit 140, to trigger a flip-flop therein to store the write data wdata from the write data generation circuit 112. At this point, the remaining write pulse signals wr_ps[0] and wr_ps[2]-wr_ps[x] are in the disable state. In this embodiment, the write pointer generation circuit 111 will sequentially generate write pointers wr_ptr corresponding to the write pulse signals wr_ps[0]-wr_ps[x], to sequentially write the write data wdata from the first entry of the storage unit 140 to the last entry of the storage unit 140. Afterwards, the write pointers wr_ptr corresponding to the write pulse signals wr_ps[0]-wr_ps[x] are generated again and the write data wdata are sequentially written again from the first entry of the storage unit 140 to the last entry of the storage unit 140, and so on.

In an embodiment, in order to reduce an error of the write pointer wr_ptr in the signal transmission, M bits of the write pointer wr_ptr will only change by one bit from one clock cycle to a next clock cycle (e.g., will be encoded by gray code). For example, under a condition that M is equal to "3", at a first cycle of the clock signal clk1, 3 bits of the write pointer wr_ptr may be "000"; at a second cycle of the clock signal clk1, 3 bits of the write pointer wr_ptr may be "001"; at a third cycle of the clock signal clk1, 3 bits of the write pointer wr_ptr may be "011"; at a fourth cycle of the clock signal clk1, 3 bits of the write pointer wr_ptr may be "010"; and so on.

In another embodiment, a Johnson code encoding can be used to implement the write pointer wr_ptr. In addition, the MUX 180 can be omitted or can be implemented by an equivalent circuit.

In operations of the second circuit module 120, the synchronizer 130 uses the clock signal clk2 to sample the write pointer wr_ptr, to generate a synchronized write pointer wr_ptr'. Simultaneously, the read pointer generation circuit 160 sequentially generates read pointers rd_ptr corresponding to the first entry to the last entry of the storage unit 140, wherein the read pointer rd_ptr and the write pointer wr_ptr have the same number of bits and the same encoding method, and a read pointer rd_ptr and a corresponding write pointer wr_ptr point to the same entry of the storage unit 140. The comparator 150 compares the synchronized write pointer wr_ptr' with the read pointer rd_ptr. If the synchronized write pointer wr_ptr' is inconsistent with the read pointer rd_ptr, it means that the entry of the storage unit 140 indicated by the read pointer rd_ptr has completed data writing. As a result, the MUX 170 generates read data rdata according to the entry of the storage unit 140 selected by the read pointer rd_ptr. The comparator 150 generates an enabling signal EN so that the read data rdata can be sent to a back-end processing circuit through the MUX 180 and the output circuit 190. In addition, at a next cycle of the clock signal clk2, the read pointer generation circuit 160 increments content of the read pointer rd_ptr to point to a next entry of the storage unit 140. If the comparator 150 determines that the synchronized write pointer wr_ptr' is still inconsistent with the read pointer rd_ptr, the MUX 170 generates the read data rdata according to the next entry of the storage unit 140 selected by the read pointer rd_ptr. At a next cycle of the clock signal clk2, the read pointer generation circuit 160 keeps incrementing the read pointer rd_ptr until the synchronized write pointer wr_ptr' is consistent with the read pointer rd_ptr, or until other conditions occur that require temporarily stopping reading of data.

In an embodiment, the write data wdata can be embedded in an associated indication field, such as a header field or a tail field (e.g., of a network frame), to support the second circuit module 120 to read data.

In the first circuit module 110 and the second circuit module 120, according to the above design arrangement of the write pointer generation circuit 111, the write data generation circuit 112 and the write pulse generation circuits 114_1-114_(x+1), conventional retimed pipeline flip-flops or other flip-flops are not needed to be inserted on the long wires between the first circuit module 110 and the second circuit module 120. The embodiments of the present invention can thereby reduce the number of flip-flops, the complexity of the clock tree design, and the power consumption. In addition, since there is no need to place the retimed pipeline flip-flops, burden on automatic placement and routing (APR) engineers can be reduced, and the circuit design can be reusable. Additionally, by generating the synchronized write pointer wr_ptr' through the synchronizer 130 in the second circuit module 120, read operations in the second circuit module 120 can be performed efficiently and correctly.

In this embodiment, the write pointer wr_ptr generated by the write pointer generation circuit 111 is sent (e.g., propagated, passed, transmitted, delivered) to the second circuit module 120 through multiple inverters, but the present invention is not limited thereto. In some embodiments, the write pointer generation circuit 111 can be placed in a region close to the second circuit module 120. Since the content of the write pointer wr_ptr and the write pulse signals wr_ps [0]-wr_ps[x] have a specific relationship, the write pointer generation circuit 111 can generate the write pointer wr_ptr according to the write pulse signals wr_ps[0]-wr_ps[x]. It is not necessary to insert a serial of the inverters/buffers chains between the write pointer generation circuit 111 and the synchronizer 130 of the second circuit module 120, or the write pointer generation circuit 111 can generate the write pointer wr_ptr according to the write pulse signals wr_ps [0]-wr_ps[x] with only few inverters/buffers required to be set.

Figure 2:
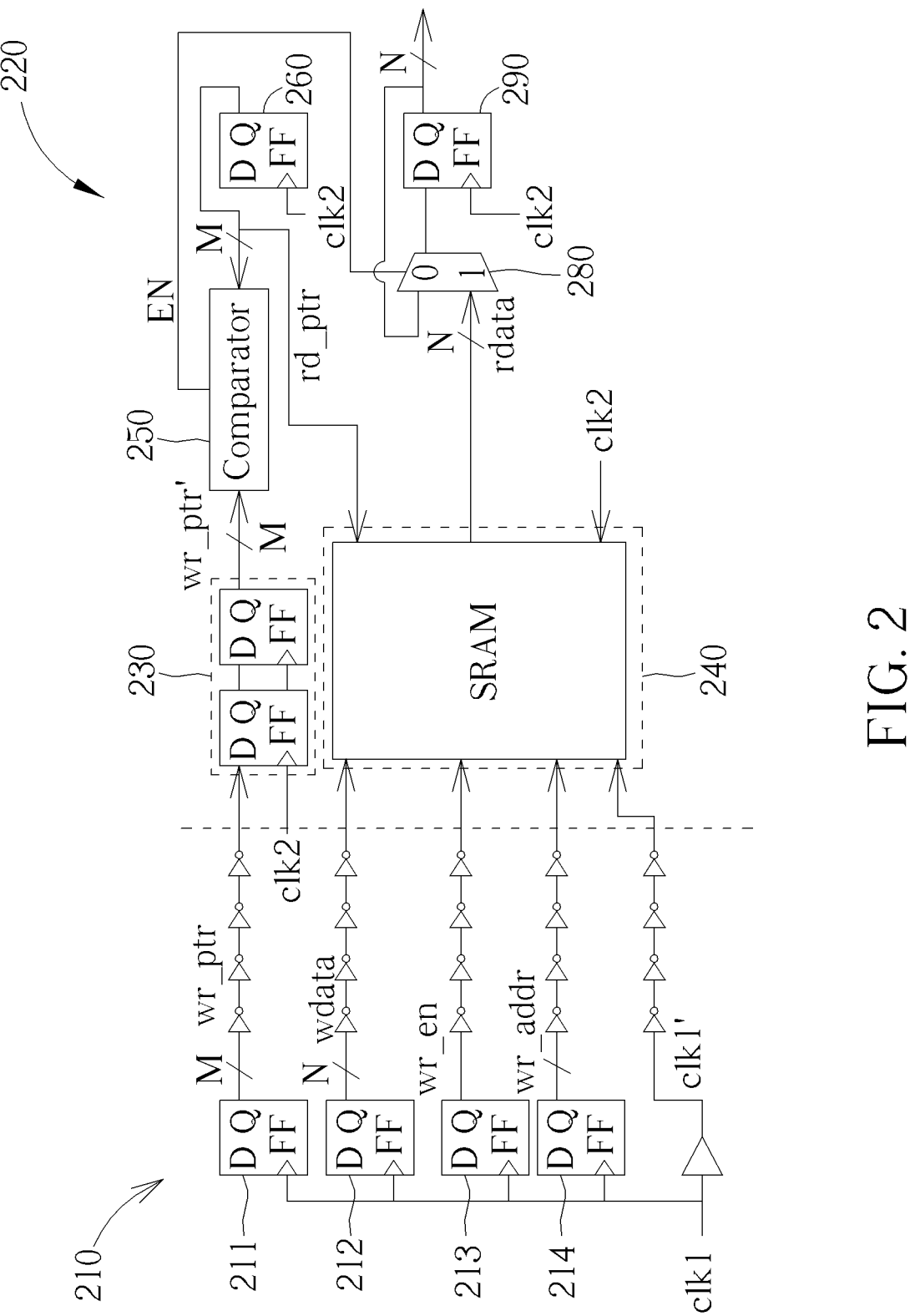
FIG. 2 is a diagram illustrating an electronic device including a first circuit module and a second circuit module according to another embodiment of the present invention.

FIG. 2 is a diagram illustrating an electronic device including a first circuit module 210 and a second circuit module 220 according to another embodiment of the present invention. As shown in FIG. 2, the first circuit module 210 includes a write pointer generation circuit 211, a write data generation circuit 212, a write enabling signal generation circuit 213, and a write address generation circuit 214. The write pointer generation circuit 211 is arranged to generate a write pointer wr_ptr with a width of M bits. The write data generation circuit 212 is arranged to generate write data wdata with a width of N bits. The write enabling signal generation circuit 213 is arranged to generate a write enabling signal wr_en to enable a storage unit (which is implemented by a static random access memory (SRAM) 240 in this embodiment) in the second circuit module 220, wherein the write enabling signal wr_en is propagated to the SRAM 240 through a wire, and a signal propagation time of the wire is greater than one cycle of a clock signal clk1. The write address generation circuit 214 is arranged to generate an address signal wr_addr to point to a specific address in the SRAM 240, wherein the address signal wr_addr is propagated to the SRAM 240 through a wire, and a signal propagation time of the wire is greater than one cycle of the clock signal clk1. It should be noted that output terminals of the write pointer generation circuit 211, the write data generation circuit 212, the write enabling signal generation circuit 213, and the write address generation circuit 214 are implemented by flip-flops, but the present invention is not limited thereto. The second circuit module 220 includes a synchronizer 230, the SRAM 240, a comparator 250, a read pointer generation circuit 260, an MUX 280, and an output circuit 290. The synchronizer 230 may be implemented by multiple stages of flip-flops, and each of the read pointer generation circuit 260 and the output circuit 290 may be implemented by flip-flops.

In this embodiment, the first circuit module 210 is arranged to write data into the second circuit module 220, and there are long-distance wires between the first circuit module 210 and the second circuit module 220 for signal transmission. Specifically, each of the write pointer generation circuit 211, the write data generation circuit 212, the write enabling signal generation circuit 213, and the write address generation circuit 214 may sent a signal to the second circuit module 220 through multiple inverters or multiple buffers, wherein signal propagation time is several clock cycles, such as 8-10 clock cycles, and signal delay between two adjacent inverters/buffers is smaller than one cycle of the clock signal clk1. In general, trace lengths of the write pointer wr_ptr, the write data wdata, the write enabling signal wr_en, the address signal wr_addr, and a clock signal clk1' should be as similar as possible (e.g., be equal to each other in length), and a number of inverters/buffers on the wires should also be as close as possible (e.g., be equal to each other). This design can make the long-distance wires obtain similar propagation delay time under different process variations, temperatures, and voltage changes. In addition, the first circuit module 210 uses the clock signal clk1 for circuit operations, and the second circuit module 220 uses a clock signal clk2 for circuit operations, wherein the clock signal clk1 and the clock signal clk2 can belong to the same clock domain or different clock domains.

In operations of the first circuit module 210, the write pointer generation circuit 211 generates the write pointer wr_ptr. Similar to the write pointer generation circuit 111 shown in FIG. 1, the content of the write pointer wr_ptr will be incremented with the cycle of the clock signal clk1. In order to reduce the error of the write pointer wr_ptr in the signal propagation, M bits of the write pointer wr_ptr will only change by one bit when entering a next clock cycle (e.g., will be encoded by gray code). In addition, at a cycle of the clock signal clk1, the write enabling signal generation circuit 213 will generate the write enabling signal wr_en, and the write address generation circuit 214 will generate the address signal wr_addr for the SRAM 240 to store the write data wdata from the write data generation circuit 212.

In another embodiment, the Johnson code encoding can be used to implement the write pointer wr_ptr shown in FIG. 2. In addition, the MUX 280 can be omitted or can be implemented by an equivalent circuit.

In operations of the second circuit module 220, the synchronizer 230 uses the clock signal clk2 to sample the write pointer wr_ptr to generate a synchronized write pointer wr_ptr'. Simultaneously, the read pointer generation circuit 260 generates the read pointer rd_ptr, wherein the read pointer rd_ptr and the write pointer wr_ptr have the same number of bits and the same encoding method, and a read pointer rd_ptr and a corresponding write pointer wr_ptr point to the same entry of the SRAM 240. The comparator 250 compares the synchronized write pointer wr_ptr' with the read pointer rd_ptr. If the synchronized write pointer wr_ptr' is inconsistent with the read pointer rd_ptr, it means that the entry of the SRAM 240 indicated by the read pointer rd_ptr has completed data writing. As a result, the SRAM 240 generates read data rdata according to the entry selected by the read pointer rd_ptr, and the comparator 250 generates an enabling signal EN so that the read data rdata can be sent to a back-end processing circuit through the MUX 280 and the output circuit 290. In addition, at a next cycle of the clock signal clk2, the read pointer generation circuit 260 increments content of the read pointer rd_ptr to point to a next entry of the SRAM 240. If the comparator 250 determines that the synchronized write pointer wr_ptr' is still inconsistent with the read pointer rd_ptr, the SRAM 240 generates the read data rdata according to the next entry selected by the read pointer rd_ptr. Afterwards, at a next cycle of the clock signal clk2, the read pointer generation circuit 260 keeps incrementing the read pointer rd_ptr until the synchronized write pointer wr_ptr' is consistent with the read pointer rd_ptr, or until other conditions occur that require temporarily stopping reading of data.

In the first circuit module 210 and the second circuit module 220, according to a design of the write pointer generation circuit 211, the write data generation circuit 212, the write enabling signal generation circuit 213, and the write address generation circuit 214, pipeline flip-flops or other flip-flops are not needed to be inserted on the long wires between the first circuit module 210 and the second circuit module 220. The embodiments of the present invention can thereby reduce the number of flip-flops, the complexity of the clock tree design, and the power consumption. In addition, since there is no need to place the retimed pipeline flip-flops, the burden on the APR engineers can be reduced, and the circuit design can be reusable. Additionally, by generating the synchronized write pointer wr_ptr' through the synchronizer 230 in the second circuit module 220, the read operations in the second circuit module 220 can be performed efficiently and correctly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device, comprising:
  a first circuit module, comprising:
    a write pointer generation circuit, arranged to generate a write pointer; and
    a write data generation circuit, arranged to generate a write data; and
  a second circuit module, comprising:
    a storage unit, arranged to store the write data;
    a read pointer generation circuit, arranged to generate a read pointer; and
    a comparator, arranged to compare the write pointer with the read pointer to determine whether to read the write data from the storage unit to generate a read data;
  wherein the write pointer generated by the write pointer generation circuit and the write data generated by the write data generation circuit are sent to the second circuit module through multiple wires, respectively, and a signal propagation time of the multiple wires is greater than one cycle of a first clock signal used by the first circuit module;

wherein the storage unit comprises multiple entries, each of the multiple entries comprises multiple flip-flops, and the first circuit module comprises:
  multiple write pulse generation circuits, arranged to generate multiple write pulse signals to the multiple entries, respectively, to selectively write the write data into one of the multiple entries;
  wherein a width of the write data is N bits, each of the multiple entries comprises N flip-flops, a width of the write pointer is M bits, a number of the multiple entries is D, and 2M is greater than D.

2. The electronic device of claim 1, wherein multiple inverters or multiple buffers are disposed on the multiple wires, respectively, to drive the write pointer and the write data, and there are no flip-flops on the multiple wires.

3. The electronic device of claim 1, wherein the multiple write pulse signals generated by the multiple write pulse generation circuits are propagated to the storage unit through other multiple wires, respectively, and a signal propagation time of the other multiple wires is greater than one cycle of the first clock signal.

4. The electronic device of claim 3, wherein multiple inverters or multiple buffers are disposed on the other multiple wires to drive the multiple write pulse signals, and there are no flip-flops on the other multiple wires.

5. The electronic device of claim 1, wherein the write pointer generation circuit generates the write pointer according to the multiple write pulse signals.

6. The electronic device of claim 1, wherein output terminals of the write pointer generation circuit, the write data generation circuit, and the multiple write pulse generation circuits are implemented by flip-flops.

7. The electronic device of claim 1, wherein a second clock signal used by the second circuit module and the first clock signal used by the first circuit module belong to different clock domains.

* * * * *